(12) United States Patent
Do et al.

(10) Patent No.: US 7,492,049 B2
(45) Date of Patent: Feb. 17, 2009

(54) MULTI-LAYER REGISTRATION AND DIMENSIONAL TEST MARK FOR SCATTEROMETRICAL MEASUREMENT

(75) Inventors: Phong Thanh Do, Camas, WA (US); Kirk Rolofson, Gresham, OR (US); David Sturdevant, Gresham, OR (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 11/768,725

(22) Filed: Jun. 26, 2007

(65) Prior Publication Data

US 2007/0246844 A1    Oct. 25, 2007

Related U.S. Application Data

(62) Division of application No. 11/046,150, filed on Jan. 28, 2005, now Pat. No. 7,258,953.

(51) Int. Cl.
*H01L 23/544* (2006.01)

(52) U.S. Cl. ..................... 257/797; 257/E23

(58) Field of Classification Search ............. 257/979, 257/E23; 438/27; 382/141, 147, 149, 151; 430/5, 22

See application file for complete search history.

(56) References Cited

U.S. PATENT DOCUMENTS

| | | | | |
|---|---|---|---|---|
| 4,231,662 A | * | 11/1980 | Feinland et al. | 356/619 |
| 4,836,682 A | * | 6/1989 | Keenan, III | 356/445 |
| 5,329,335 A | * | 7/1994 | Wada et al. | 355/53 |
| 5,418,092 A | * | 5/1995 | Okamoto | 430/5 |
| 5,789,118 A | * | 8/1998 | Liu et al. | 430/5 |
| 6,061,606 A | * | 5/2000 | Ross | 700/121 |
| 6,433,878 B1 | * | 8/2002 | Niu et al. | 356/603 |
| 6,517,982 B2 | * | 2/2003 | Fujimoto | 430/22 |
| 6,883,160 B2 | * | 4/2005 | Tsuchiya et al. | 716/21 |
| 6,985,618 B2 | * | 1/2006 | Adel et al. | 382/151 |

\* cited by examiner

*Primary Examiner*—Sang Nguyen
(74) *Attorney, Agent, or Firm*—Utah Valley Patent Services, LLC

(57) ABSTRACT

A layered test pattern for measuring registration and critical dimension (CD) for multi-layer semiconductor integrated circuits is disclosed. A first layer includes a first pattern having vertical and horizontal portions. A second layer is formed over the first layer and includes a second pattern having vertical and horizontal portions having nominal vertical and horizontal phase shifts with respect to the vertical and horizontal portions, respectively, of the first pattern. The vertical and horizontal portions include periodically repeating vertical lines and horizontal lines, respectively. The nominal phase shifts may be half of the period of the vertical and horizontal lines. A scatterometry tool measures the width of the lines and the phase shift of the first pattern relative to the second pattern. The width of the lines corresponds to CD, whereas the difference between the measured phase shift and the nominal phase shift indicates variation in registration.

7 Claims, 5 Drawing Sheets

MULTI-LAYER REGISTRATION AND DIMENSIONAL TEST MARK FOR SCATTEROMETRICAL MEASUREMENT

RELATED APPLICATIONS

This application claims priority to, and is a divisional of, U.S. application Ser. No. 11/046,150 filed on 28 Jan. 2005 now U.S. Pat. No. 7,258,953 for Phong Thanh Do, Kirk Rolofson, and David Sturtevant, which application is incorporated herein by reference.

BACKGROUND OF THE INVENTION

1. Field of the Invention

The invention relates generally to apparatus and method for evaluating semiconductors, and more particularly to apparatus and method for measuring the registration and critical dimension (CD) of deposited layers.

2. Description of the Related Art

The need for faster and faster semiconductor integrated circuits (IC) has resulted in a decrease in the size of electronic elements formed on semiconductors, such as transistors and conductive paths. As a result, process variations during manufacture of semiconductors must be more accurately measured and more tightly controlled.

A typical integrated circuit is formed on a substrate wafer made of silicon or another semiconductor, such as gallium arsenide (GaAs) and indium phosphide (InP). The substrate then undergoes various processes such as layering, oxidation, etching, and doping in order to form transistors and conductive paths thereon. Layering typically includes depositing layers of silicon or metal on the semiconductor.

The processes of etching and doping typically include coating the surface of the semiconductor with a photoresist compound; exposing the photoresist compound to light passing through a mask to either harden or soften areas of the compound according on the nature of the photoresist compound; removing soft areas of the photoresist compound; etching or doping the areas of the semiconductor not covered by photoresist compound; and, finally, stripping the cured photo resist from the semiconductor. After doping, etching, or layering, the semiconductor may also undergo polishing, such as chemical mechanical polishing (CMP), wherein wafer surfaces are polished to maintain wafer flatness during processing Each step in the process may have random variation, which in turn may cause variation in the performance of the finished semiconductor. Accordingly, at various stages in the manufacture of a semiconductor, the registration and critical dimension (CD or CD SEM) of the various elements forming the semiconductor may be measured. Registration, or overlay, is a measurement of the alignment of the mask used to create a pattern of lit and unlit portions on the photoresist compound. Misalignment of the mask may cause problems, such as short circuiting, interrupted conduction pathways, or malformed transistors. Another measurement is the CD—a measure of a linear dimension of an element forming part of an integrated circuit, such as a series of parallel lines. Variation in the CD may result in conductive paths that are too wide, bridging into neighboring conductive paths and causing a short circuit. If the conductive paths are too small, the increased resistance will degrade the processing speed of the completed IC.

Referring to FIG. 1, in prior systems, scanning electron microscopes (SEM) have been used to measure CD. However, an SEM is extremely expensive. Due to the expense of the SEM, a separate registration tools is often used to measure registration in order to maximize use of the SEM. A separate, less expensive registration tool is used to measure registration due to the reduced need for precision. Scatterometry tools have been used in recent years to measure CD in the optical disk fabrication industries. Scatterometry tools are capable of very fast and very accurate measurements and are less expensive than an SEM. In typical applications, a test mark 100 is formed on the disk comprising a grating of vertical lines 102 and a grating of horizontal lines 104. A scatterometry tool measures attributes reflected from the gratings in order to determine the width of the lines.

Referring to FIG. 2, in prior systems a separate registration mark 200 is formed on a semiconductor comprising outer marks 202 corresponding to one layer of deposited material and inner marks 204 corresponding to a second layer of material. By comparing the location of the marks 202, 204, the registration tool is capable of measuring errors in registration between the layers.

The foregoing measurement process requires two expensive tools: an SEM and a registration tool. In addition, the foregoing inspection process requires that a silicon wafer be mounted and dismounted in the two different tools. This introduces expense, delay, and risk of breakage into the manufacturing process.

Accordingly, it would be an advancement in the art to provide a test mark enabling accurate measurement of both CD SEM and registration with a single tool. It would be a further advancement if the test mark were measurable by a scatterometry tool.

SUMMARY OF THE INVENTION

The present invention has been developed in response to the present state of the art, and in particular, in response to the problems and needs in the art that have not yet been fully solved by currently available test marks and measurement systems. Accordingly, the present invention has been developed to provide an apparatus, system, and method for simultaneously measuring CD and registration of semiconductors with a single tool.

A base layer such as a semiconductor substrate may have a plurality of layers formed thereon. A first layer includes a first pattern having a vertical portion and a horizontal portion. The second layer includes a second pattern having vertical and horizontal portions having a phase shift or offset relative to the vertical and horizontal portions of the first pattern.

The vertical portion includes a formations repeating periodically in a vertical direction, whereas the horizontal portion includes formations repeating periodically in a horizontal direction. In one embodiment the vertical and horizontal portions are vertical and horizontal lines, respectively. The nominal offset may be equal to half the period of the repeating patterns.

A scatterometry tool measures the overlaid first and second patterns, measuring the width and locations of the vertical and horizontal lines. The actual phase shift of the vertical lines of the first pattern relative to the vertical lines of the second pattern is measured and compared to a nominal value to determine variation in horizontal registration. Likewise, the phase shift of the horizontal lines of the first pattern relative to the horizontal lines of the second pattern is evaluated to determine variation in vertical registration. The width of one or more lines is evaluated to determine CD.

The present invention provides benefits and advantages over the prior art. Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

Figure 1:
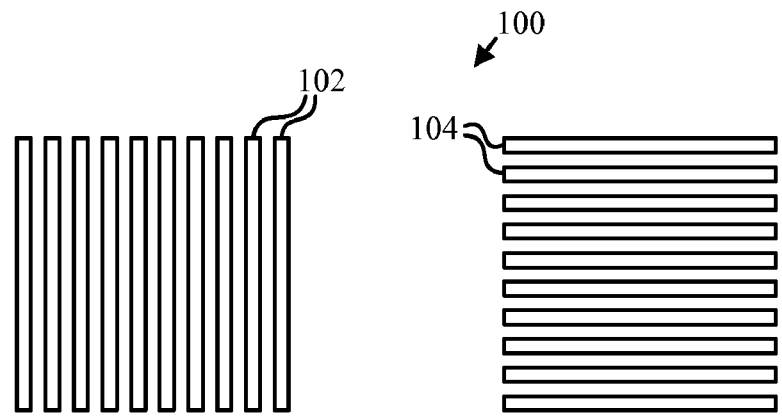
FIG. 1 is a top view of a scatterometry mark.
Figure 2:
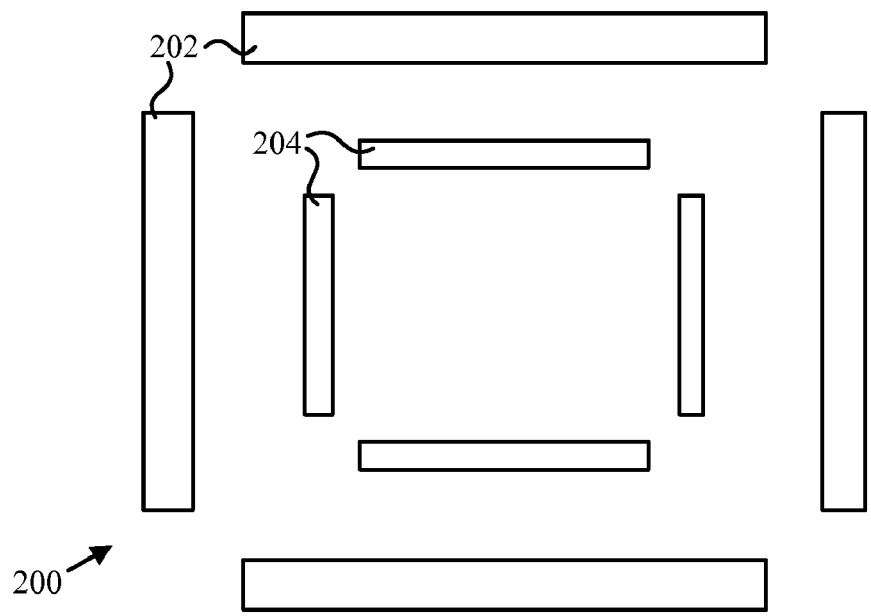
FIG. 2 is a top view of a registration mark.
Figure 3:
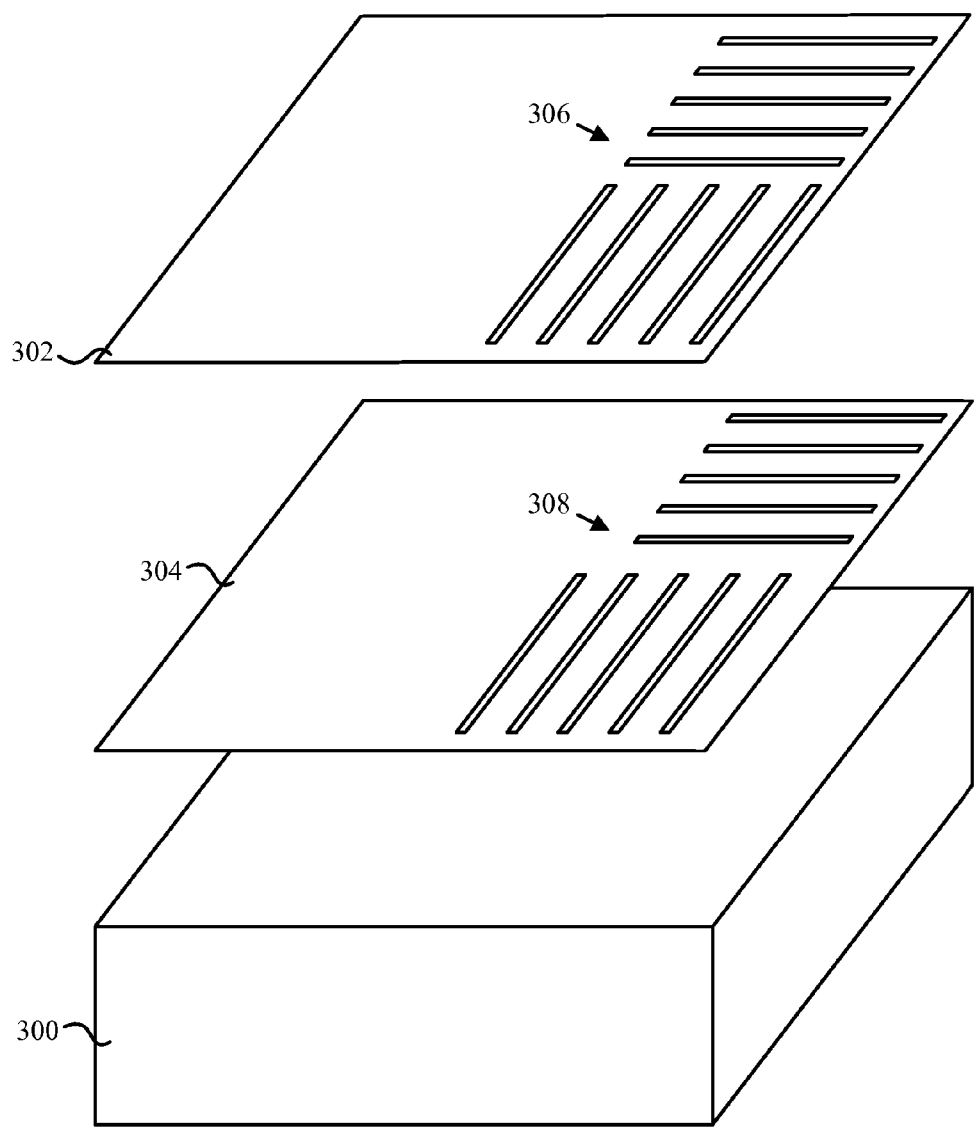
FIG. 3 is a perspective view of a test mark, in accordance with the present invention.

Referring to FIG. 3, a semiconductor 300, or semiconductor wafer 300, may have a plurality of layers deposited thereon, such as an upper layer 302 and a lower layer 304. The layers 302, 304 may include a semiconductor such as silicon, gallium arsenide (GaAs), or indium phosphide (InP). A semiconductor layer may be formed by epitaxial growth, chemical vapor deposition (CVD, or like process. Alternatively, a layer 302, 304 may be made of a metal such as titanium, platinum, gold, molybdenum, tungsten, nickel, or cobalt. Metal layers may be deposited by means of CVD, sputtering, or like process. The layers 302, 304 may have patterns 306, 308, respectively, formed therein. The patterns 306, 308 may be formed in the layers 302, 304 by etching or a like process.

Figure 4A:
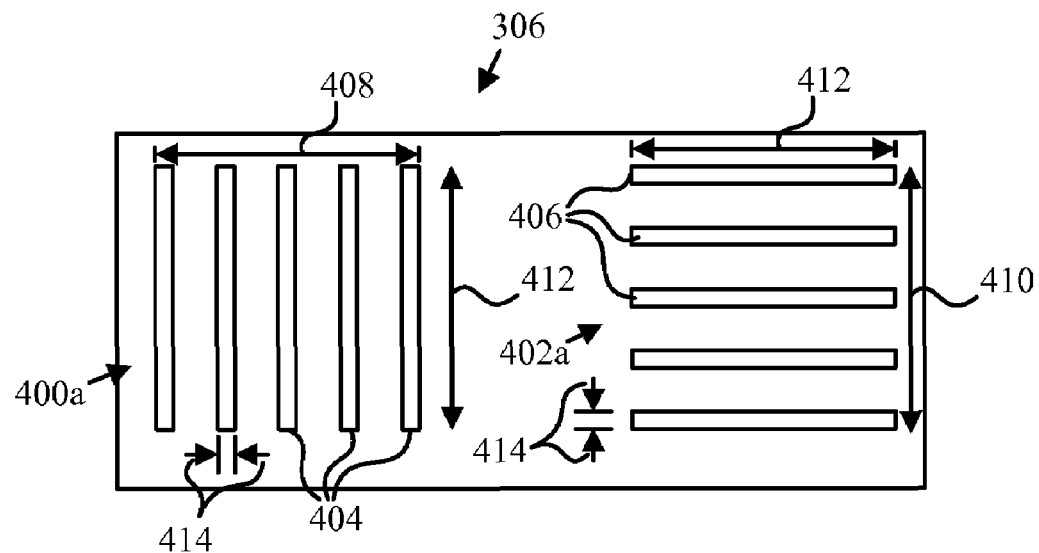
FIG. 4A is a top view of a first pattern forming a test mark, in accordance with the present invention.
Figure 4B:
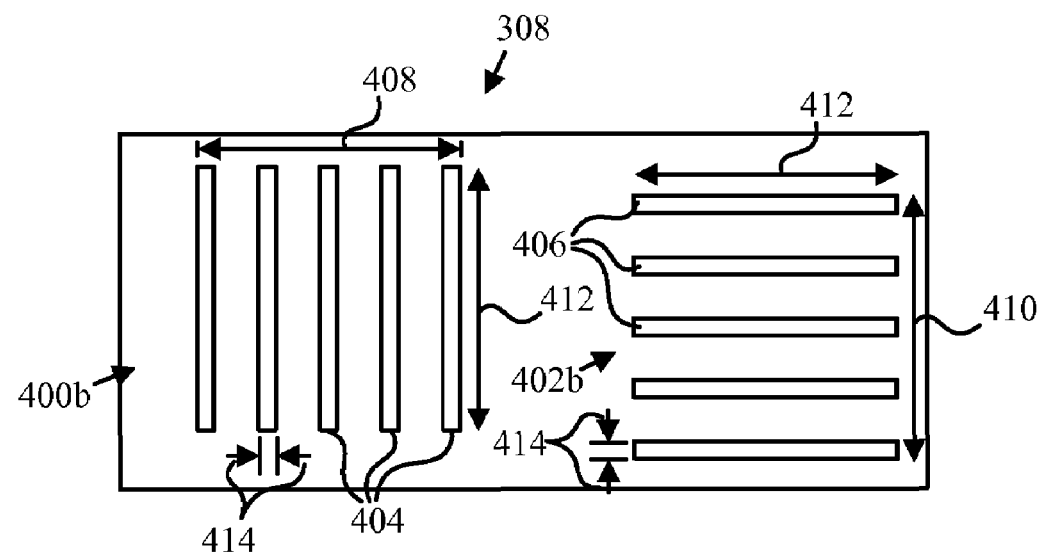
FIG. 4B is a top view of a second pattern forming a test mark, in accordance with the present invention.

Referring to FIGS. 4A and 4B, the pattern 306 may include a vertical portion 400a and a horizontal portion 402a. The pattern 308 may likewise include a vertical portion 400b and a horizontal portion 402b. The vertical portions 400a, 400b may include a series of equally spaced vertical lines 404. The horizontal portions 402a, 402b may include a series of equally spaced horizontal lines 406. The total width 408 of the vertical portions 400a, 400b and the total length 410 of the horizontal portions 402a, 402b may be approximately 50 nanometers. In certain embodiments, lines 404, 406 may have a length 412 of approximately 50 nanometers. The width 414 of the individual lines 404, 406, or an average of the widths 414, may serve as the CD measured to evaluate a fabrication process.

Figure 5:
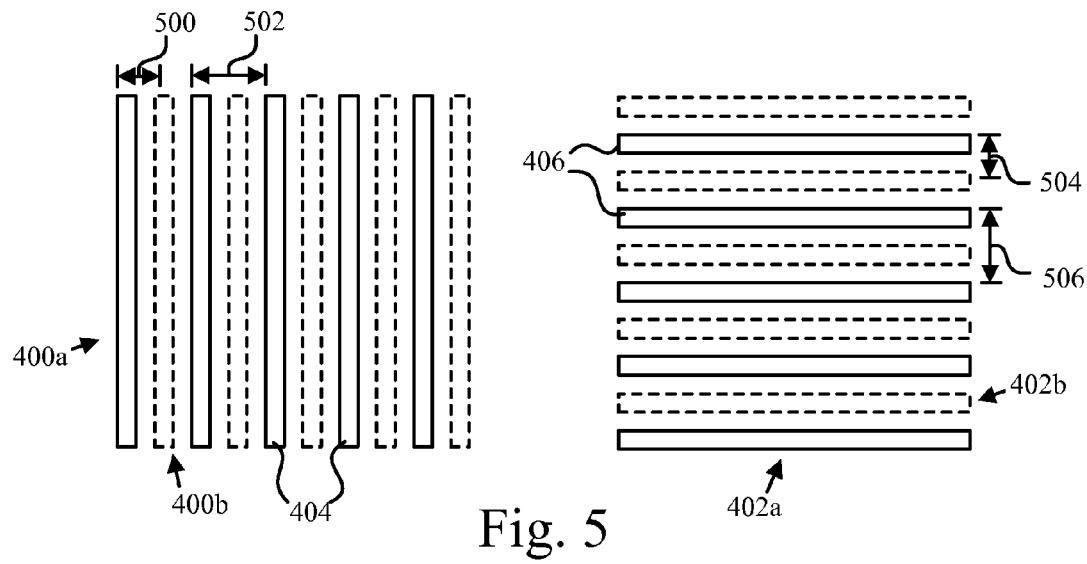
FIG. 5 is a top view of overlaid first and second patterns, in accordance with the present invention.

Referring to FIG. 5, the vertical portion 400a (shown with solid lines) may have a nominal phase shift 500 in the horizontal direction relative to the vertical portion 400b (shown with broken lines). In the illustrated embodiment, the nominal phase shift 500 equals one half the period 502 of the repeating lines 404. The horizontal portion 402a may have a nominal phase shift 504 in the vertical direction relative to the horizontal portion 402b. In the illustrated embodiment, the nominal phase shift 504 equals one half the period 506 of the repeating lines 406. The measured value of the nominal phase shift 500, 504 may vary according to variation in the manufacturing process. Accordingly, the measured values for the phase shifts 500, 504 indicate errors in the registration in the horizontal and vertical directions, respectively.

Figure 6:
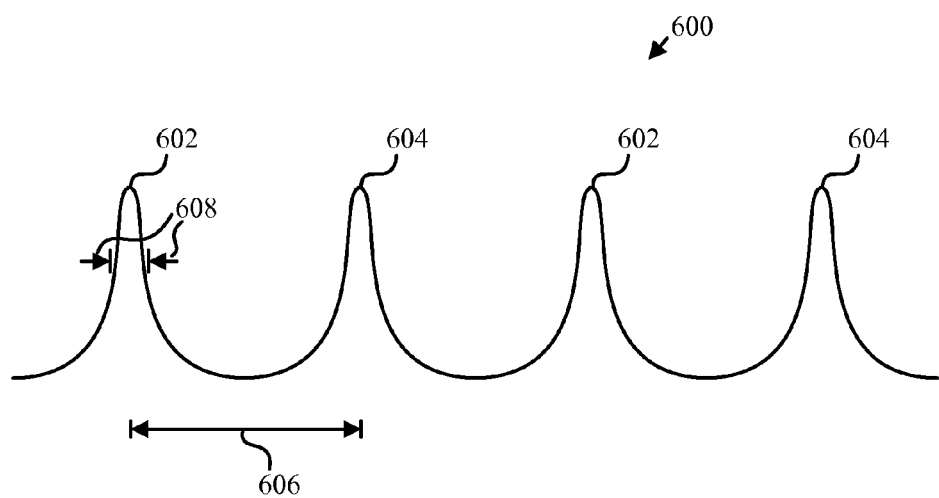
FIG. 6 is a plot of an output signal from a scatterometry tool, in accordance with the present invention.

Referring to FIG. 6, a scatterometry tool may scan the patterns 306, 308 and derive an output having a form similar to the plot 600 for the combined vertical portions 400a, 400b and the combined horizontal portions 402a, 402b. The peaks of the plot alternate between the lines 404, 406 of the pattern 306 and the lines 404, 406 of the pattern 308. For example, the peaks 602 may represent measurements of the lines 404 of the vertical portion 400a, whereas peaks 604 represent measurements of the lines 404 of the vertical portion 400b. Alternatively, the peaks 602 may represent measurements of the lines 406 of the horizontal portion 402a, whereas peaks 604 represent measurements of the lines 406 of the horizontal portion 402b.

The value of the phase shift 606 of the peaks 602 relative to the peaks 604 corresponds to the phase shift 500, 504. The phase shift 606 may be interpreted to determine the variation in registration in the vertical or horizontal direction. The width 608 of the peaks 602, 604 may be evaluated to determine the value of CD. The widths 608 of the peaks 602, 604 may be averaged to evaluate CD or a single width 608 may be measured. In some embodiments, other characteristics such as the standard deviation of the widths 608 may be calculated as a measure of variation within a pattern 306,308.

Figures 7A, 7B:
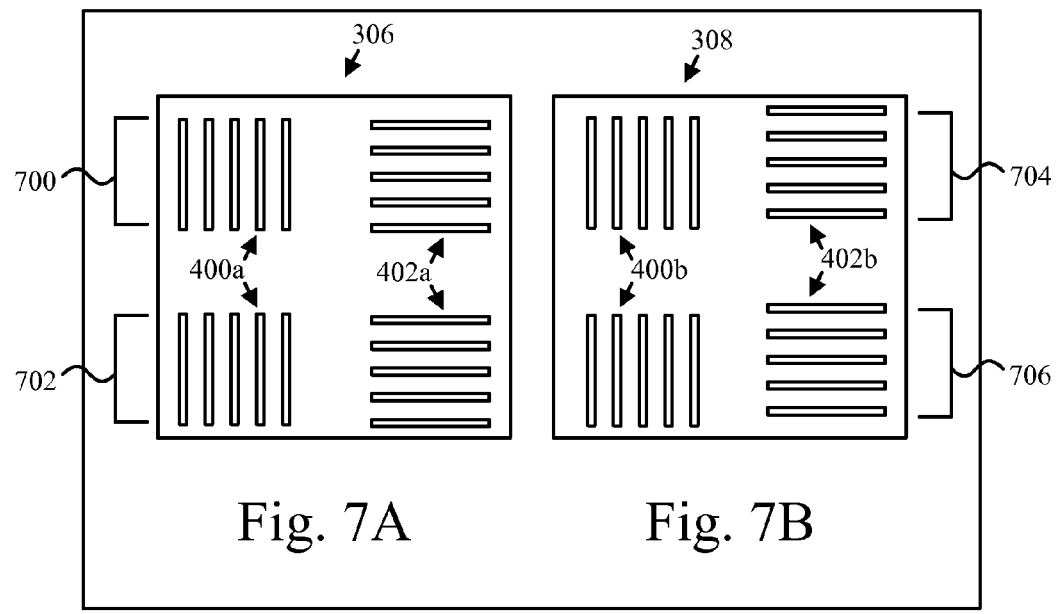
FIG. 7A is a top view of an alternative embodiment of a first pattern, in accordance with the present invention.
FIG. 7B is a top view of an alternative embodiment of a second pattern in accordance with the present invention.

Referring to FIG. 7, the patterns 306,308 may include repeated vertical portions 400a,400b and horizontal portions 402a,402b. For example, the pattern 306 may include an upper instance 700 and a lower instance 702 each having a vertical portion 400a and a horizontal portion 402a. The pattern 308 may include an upper instance 704 corresponding to the upper instance 700 and a lower instance 706 corresponding to the lower instance 702. The upper instance 704 and lower instance 706 may each comprise both a vertical portion 400b and horizontal portion 402b in positions substantially mirroring the positions of the vertical portion 400a and horizontal portion 402a, respectively.

The vertical portion 400a of the upper instances 700,704 and lower instances 702,706 may either be aligned vertically or be offset. In a like manner, the horizontal portions 402a, 402b of the upper instances 700,704 and lower instances 702,706 may either be aligned vertically or be offset. In the illustrated embodiment, the vertical portions 400a,400b are aligned, as are the vertical portions 402a,402b.

The use of repeated vertical portions 400a,400b and horizontal portions 402a,402b may enable measuring of registration and CD SEM where one set of vertical portions 400a, 400b or horizontal portions 402a,402b are malformed or worn off during polishing. Furthermore, by comparing the values of the actual phase shifts 606 one can evaluate angular deviations in registration. Thus, for example, the vertical portion 400a of the upper instance 700 has a first actual phase shift 606 relative to the vertical portion 400b of the upper instance 704. However, the vertical portion 400a of the lower instance 702 may have a second actual phase shift 606 relative to the vertical portion 400b of the lower instance 706. The difference between the first actual phase shift 500 and the second phase shift 500 indicates an angular variation in registration. Where the distance between the upper instances 700,704 and the lower instances 702,706 is known, the difference in values may be resolved into an angle using trigonometry.

Figure 8:
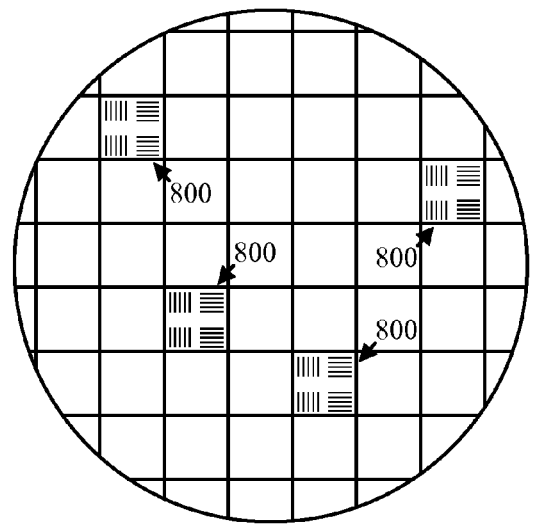
FIG. 8 is a top view of a silicon wafer bearing a plurality of test patterns, in accordance with the present invention.

Referring to FIG. 8, instances 800 of overlaid patterns 306,308 may be deposited at multiple points on a semiconductor wafer 300. Multiple instances 800 may enable measurement of registration and CD SEM at various points on the wafer 300 to ensure uniform fabrication processes across the entire wafer 300.

What is claimed is:

1. A layered pattern for evaluating layer properties, the layered pattern comprising:
   a base layer;
   a first layer deposited directly on the base layer, the first layer comprising a first pattern;
   a second layer deposited over the first layer, the second layer comprising a second pattern having a phase shift relative to the first pattern and being substantially identical to the first pattern; and
   wherein the first and second patterns each comprise a first vertical portion and a first horizontal portion; and
   wherein the phase shift of the first vertical portion of the second pattern is in a horizontal direction relative to the first vertical portion of the first pattern, and wherein the phase shift of the first horizontal portion of the second pattern is in a vertical direction relative to the first horizontal portion of the first pattern.

2. The pattern of claim 1, wherein the first vertical portion comprises periodically disposed vertical lines and wherein the first horizontal portion comprises periodically disposed horizontal lines.

3. The pattern of claim 1, wherein the first and second patterns each further comprise a second vertical portion and a second horizontal portion.

4. The pattern of claim 3, wherein the first and second vertical and horizontal portions of the first and second patterns are each disposed at the corners of a square.

5. The pattern of claim 4, wherein the first and second vertical portions of the first and second patterns are disposed at adjacent corners of the square.

6. The pattern of claim 1, wherein the base layer is a semiconductor wafer.

7. The pattern of claim 1, wherein the first and second layers comprise a metal.

* * * * *